United States Patent [19]

Sivan

[11] Patent Number: 5,229,310
[45] Date of Patent: Jul. 20, 1993

[54] METHOD FOR MAKING A SELF-ALIGNED VERTICAL THIN-FILM TRANSISTOR IN A SEMICONDUCTOR DEVICE

[75] Inventor: Richard D. Sivan, Austin, Tex.

[73] Assignee: Motorola, Inc., Schaumburg, Ill.

[21] Appl. No.: 887,956

[22] Filed: May 26, 1992

Related U.S. Application Data

[62] Division of Ser. No. 695,129, May 3, 1991, abandoned.

[51] Int. Cl.⁵ .......................................... H01L 21/265
[52] U.S. Cl. ..................... 437/41; 437/913; 437/235; 148/DIG. 150
[58] Field of Search .............. 437/41, 40, 56, 51, 437/59, 63, 913, 915; 357/42, 44; 148/DIG. 150

[56] References Cited

U.S. PATENT DOCUMENTS

| | | | |
|---|---|---|---|
| 4,364,074 | 12/1982 | Garnache et al. | 357/41 |
| 4,845,537 | 7/1989 | Nishimura et al. | 357/41 |
| 4,845,539 | 7/1989 | Inoue | 357/41 |
| 4,864,374 | 9/1989 | Banerjee | 357/41 |
| 4,982,250 | 1/1991 | Manos, II et al. | 357/54 |
| 5,012,308 | 4/1991 | Hieda | 357/41 |
| 5,122,848 | 6/1992 | Lee et al. | |

FOREIGN PATENT DOCUMENTS

| | | | |
|---|---|---|---|
| 0145567 | 6/1985 | European Pat. Off. | |
| 2139936 | 5/1990 | Japan | 437/984 |
| 2199871 | 8/1990 | Japan | 437/51 |

*Primary Examiner*—Brian E. Hearn
*Assistant Examiner*—Michael Trinh
*Attorney, Agent, or Firm*—Patricia S. Goddard

[57] ABSTRACT

A thin-film transistor in a semiconductor device is self-aligned and vertically oriented. In one form of the present invention, the semiconductor device (10) has a vertical wall trench (18) formed in a first dielectric layer (16) and having a predetermined depth. A first current electrode (26) is formed on a bottom surface of the trench while a second current electrode (28) overlies the first dielectric material, each current electrode preferably being formed of polysilicon. A channel region (30) connecting the first and second current electrodes lies along the vertical wall of the trench and has a length substantially equal to the predetermined depth. A control electrode (36) is located within the trench and is also preferably formed of polysilicon. The control electrode is electrically isolated from the first current electrode and the channel region by a second dielectric layer (32).

17 Claims, 4 Drawing Sheets

5,229,310

METHOD FOR MAKING A SELF-ALIGNED VERTICAL THIN-FILM TRANSISTOR IN A SEMICONDUCTOR DEVICE

CROSS-REFERENCE TO A RELATED APPLICATION

This is a divisional of application Ser. No. 07/695,129, filed May 3, 1991, now abandoned.

The present invention is related to a commonly assigned co-pending application entitled, "AN INTEGRATED CIRCUIT MEMORY DEVICE AND STRUCTURAL LAYOUT THEREOF," by Sivan, Ser. No. 07/695,053 filed May 3, 1991 filed concurrently herewith.

TECHNICAL FIELD OF THE INVENTION

The present invention relates to semiconductor devices in general, and more specifically to semiconductor devices having thin-film transistors and a method for making the same.

BACKGROUND OF THE INVENTION

Transistors are one of the major components of semiconductor devices. A transistor is comprised of three electrodes which are often referred to as a source, a drain, and a gate. The gate overlies a channel region which links the source and drain. Typically, the source and drain are formed in a single crystal silicon substrate by doping selected portions of the substrate. The gate is ordinarily formed from polycrystalline silicon, or polysilicon, which is deposited over the substrate. While these conventional bulk transistors (i.e. transistors formed in a bulk substrate) revolutionized semiconductor devices, new transistor applications and demands of increased performance and decreased size have led semiconductor manufacturers to develop new methods of forming transistors. One such method involves using polysilicon or amorphous silicon to form all electrodes of the transistor. These silicon transistors are also referred to as thin-film transistors (TFTs).

Thin-film transistors have several advantages over conventional bulk transistors. One significant advantage is that TFTs have the potential to be built one above the other, whereas bulk transistors are limited to fabrication within one level of a semiconductor device. Fabricating multilevel transistors enables the size of a semiconductor device to be substantially reduced while meeting the circuit performance demand. Another advantage is that TFTs are less susceptible to latch-up phenomenon and soft errors caused by incident alpha particles. One reason TFTs are more immune to soft errors is that the integration of TFTs into large scale circuits typically results in a larger capacitance. Another reason TFTs are less susceptible to the above problems is because TFTs are most often formed on an insulating layer rather than on a conducting or semiconducting substrate. Bulk transistors have channel regions which are contained within a very large semiconductor substrate material. Therefore, electrical phenomena occurring in the substrate have the potential to also influence the channel region. Channel regions in TFTs are usually isolated from the substrate by a dielectric material such that electrical effects in the substrate have no effect on the channel region.

Thin-film transistors are being explored for use in a number of integrated circuit semiconductor devices including flat panel or active matrix displays and MOS (metal oxide semiconductor) structures. Applications such as these sometimes require a high density of transistors. The use of TFTs is one appropriate way of achieving more dense circuitry, for example by fabricating multiple levels of thin-film transistors. But as the number of levels in a semiconductor device increases, so does fabrication complexity. Another problem with using conventional TFTs to increase transistor density is that many applications, particularly display applications, cannot utilize multiple layers of transistors. To avoid process complexity and limitations imposed by multiple layer transistors, some semiconductor manufacturers are focusing on increasing transistor density by reducing the size of individual transistors. However, most TFT structures have a horizontal orientation which results in transistors occupying a relatively large area within the device. Although existing TFT structures are very thin, as the name suggests, the horizontal dimensions or area of many TFTs are typically larger than existing bulk transistors due to the need to control short channel phenomena. Thus, the use of TFTs does not necessarily result in a smaller device.

Another problem associated with existing TFT structures, and also with existing bulk transistors, is channel length control. As mentioned above, most existing TFTs, and bulk transistors, are horizontal or planar structures having a horizontally oriented gate overlying a horizontally oriented channel region. Because many fabrication processes are self-aligned processes, the channel length is determined by the length of the gate. Typically, the gate is used to mask the channel region from dopants during formation of self-aligned (actually gate-aligned) source and drain regions. Thus, the distance between the source and drain regions, in other words the channel length, is determined by the gate dimension. In manufacturing, the gate dimension of a planar transistor can vary up to 20 percent in any given batch of devices. With such a variance in gate dimensions and therefore channel length, electrical characteristics and overall device performance are difficult to control.

Yet another problem with known TFTs is that many of the proposed TFT structures and fabrication processes employ amorphous, or non-crystalline, silicon as an electrode material, particularly for N-channel transistors used in active matrix display applications. However, digital circuit applications for TFTs require a higher carrier mobility than that provided by amorphous silicon, which is frequently used in active matrix display transistors. An additional disadvantage in using amorphous silicon in TFTs is that amorphous silicon deposition techniques are complex and not widely understood.

Therefore, a need exists for an improved semiconductor device, and more specifically for a semiconductor device having a thin-film transistor which has reduced transistor area, has highly controllable channel length, and is readily manufacturable.

BRIEF SUMMARY OF THE INVENTION

In one form, a self-aligned vertical thin film transistor is formed in a semiconductor device. A first dielectric material defines a substantially vertical wall trench having a predetermined depth. A first current electrode comprising a first material is formed on a bottom surface of the trench. A second current electrode comprising the first material overlies the first dielectric material. A control electrode comprising a second material is formed within the trench, overlying the first current electrode. A channel region is positioned along the vertical wall of the trench and has a length substantially equal to the predetermined depth. A second dielectric electrically isolates the control electrode from the channel region and the first current electrode.

DETAILED DESCRIPTION OF A PREFERRED EMBODIMENT

The present invention has several advantages over existing thin-film transistor (TFT) structures and fabrication processes. One advantage is that the present invention establishes a vertically oriented transistor which enables transistor density within a semiconductor device to be increased. Another advantage is that the channel length of a transistor in accordance with the present invention is tightly controlled because the channel length is determined by the thickness of a dielectric layer. Dielectric layers can be deposited to a desired thickness with a high degree of accuracy, usually within about 5 percent. The channel length of most existing transistors is determined by the width of a polysilicon gate, which is only controllable to within about 20 percent. Another advantage is that the channel is vertically oriented and adjacent to an insulating material which reduces the transistor's photo-sensitivity (i.e. sensitivity to light). Furthermore, the present invention has self-aligned source and drain electrodes, and may also be fabricated with a self-aligned gate if desired. Therefore, critical alignment steps during the fabrication process of a device in accordance with the present invention are reduced. In addition, the present invention can employ polysilicon electrodes rather than amorphous silicon electrodes, further simplifying fabrication complexity.

Figure 1A:
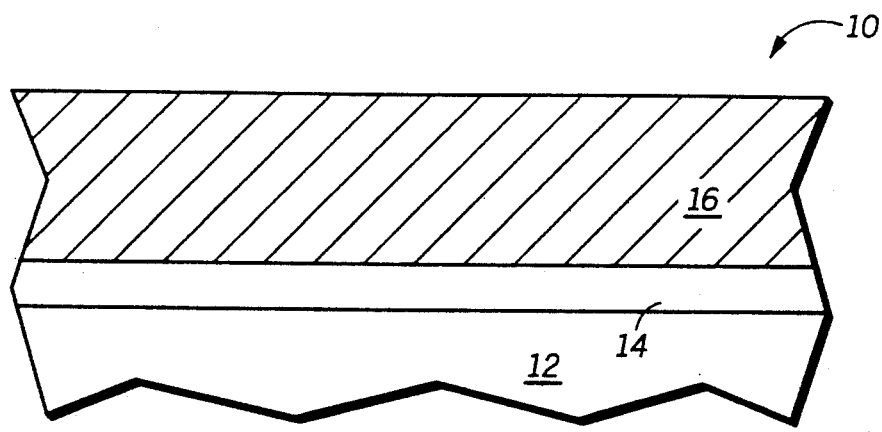
FIGS. 1A-1F are cross-sectional views of a portion of a semiconductor device which illustrate a process for making a thin-film transistor in accordance with the present invention.

Illustrated in FIGS. 1A-1F are cross-sectional views depicting a process for forming a thin-film transistor in accordance with the present invention. As illustrated in FIG. 1A, a semiconductor device 10 includes a substrate material 12. Substrate material 12 may be any material within semiconductor device 10 including, but not limited to, a conductor, a semiconductor, or a dielectric. The composition of substrate material 12 will most often be determined by the applications in which a transistor is to be used. For example, in digital circuit applications substrate material 12 may be a semiconductor such as silicon, while in active matrix display applications substrate material 12 may be a dielectric such as quartz or ordinary glass. It should be noted that the material used for substrate material 12 is not important to understanding, and in no way limits, the present invention.

Figure 2:
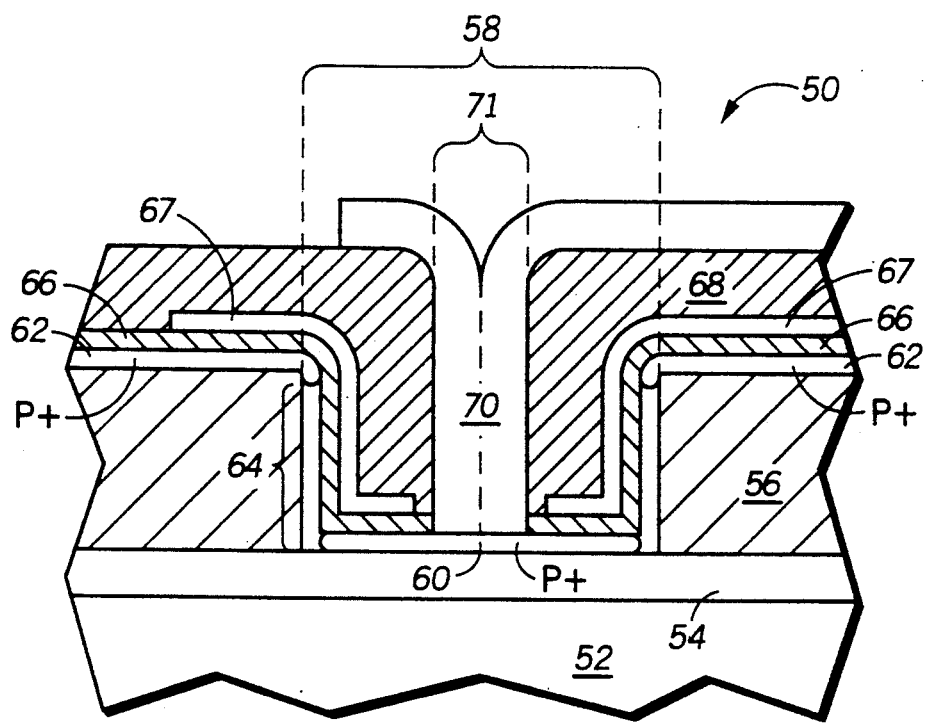
FIG. 2 is a cross-sectional view of a portion of a semiconductor device which illustrates another embodiment of the present invention.
Figure 3:
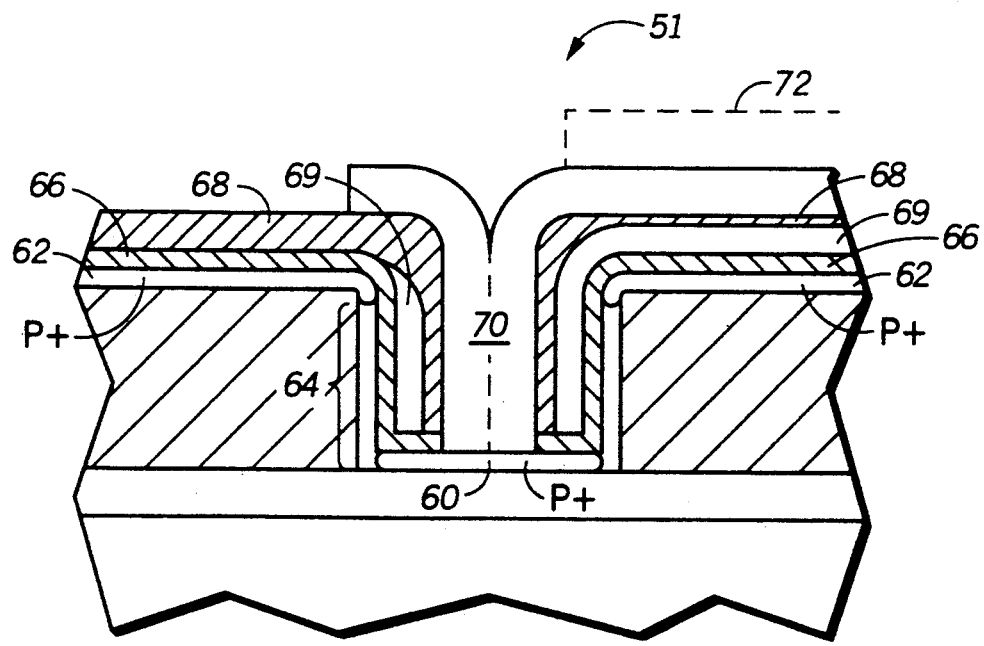
FIG. 3 is also a cross-sectional view of a portion of a semiconductor device which illustrates yet another embodiment of the present invention.

Overlying substrate material 12 is an etch stop 14, also illustrated in FIG. 1A. The material chosen for etch stop 14 should be one which has the ability to resist etching by a chemistry which will etch a first dielectric layer 16. Etch stop 14 may be of a conductive material, such as polysilicon or a refractory metal silicide, in order to also act as an electrode connection as will be illustrated later. A non-conductive etch stop may also be used, as illustrated in the embodiments of FIGS. 2 and 3. Referring again to FIG. 1A, first dielectric layer 16 is formed on etch stop 14 by a conventional deposition method. Suitable dielectric materials include $SiO_2$, PSG (phospho-silicate glass), TEOS (tetra-ethyl-orthosilicate), $Si_3N_4$, or the like. The thickness of the first dielectric layer 16 should be approximately equal to the desired channel length thickness of a transistor which will be formed therein. As an example, a suitable first dielectric layer thickness may be on the order of 0.5-2.0 μm.

Figure 1B:
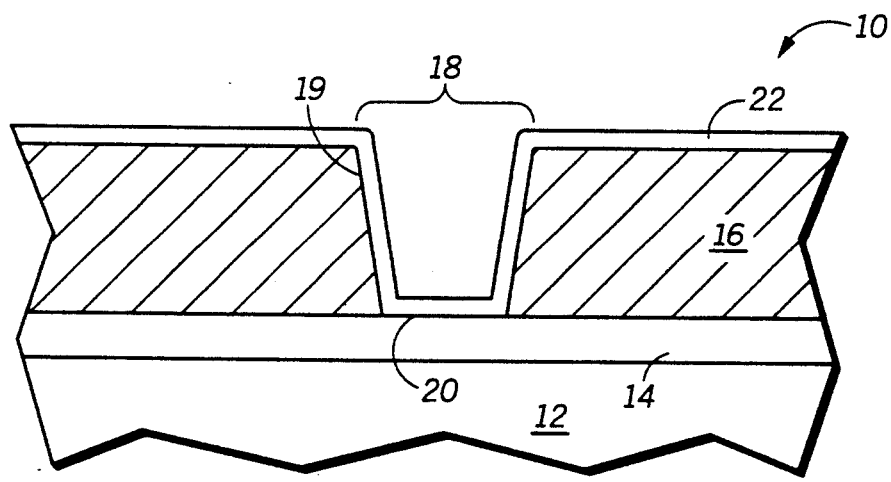

First dielectric layer 16 is then patterned to form a trench 18 as illustrated in FIG. 1B. Trench 18 is formed in a conventional manner using known lithography and etching techniques. Etch stop 14 aids in forming trench 18 by establishing an "automatic" etch stopping point because the chemistry used to etch trench 18 is chosen so as not to attack etch stop 14. If substrate material 12 is itself a dielectric material, for instance quartz or glass, trench 18 may be formed directly in the substrate without the need for a first dielectric layer 16. In forming the trench in a dielectric substrate, an etch stop may not be required in which case the trench depth should be tightly controlled since this depth also determines channel length of the transistor formed therein. Trench 18 has a substantially vertical wall 19 and a bottom surface 20 which is defined by etch stop 14. A substantially vertical wall trench, such as trench 18, can be formed by known anisotropic etching techniques, in other words techniques which etch in one direction. Although it is not evident from the illustrations, trench 18 is more or less a hole intentionally formed in first dielectric layer 16. The trench shape may be cylindrical, rectangular, square, or other shape. The shape of trench 18 is not restricted in any way by the present invention; however, it is important to keep in mind the shape of the trench when reviewing the illustrations in order to understand how a transistor formed within the trench functions.

Also illustrated in FIG. 1B, a first conductive material 22 is deposited on first dielectric layer 16 and along the wall and bottom surface of the trench. First conductive material 22 is preferably of polysilicon, although other conductive materials are also suitable, including amorphous silicon, germanium, III-V semiconductors, II-VI semiconductors, diamond, or the like. First conductive material 22 may be either undoped or lightly doped, depending on the intended application of the semiconductor device. The thickness of the first conductive material should be kept small enough to avoid substantially filling trench 18 for reasons to become evident later in this discussion. A suitable range for the thickness of conductive material 22 is from about 5 nm to 100 nm.

Figure 1C:
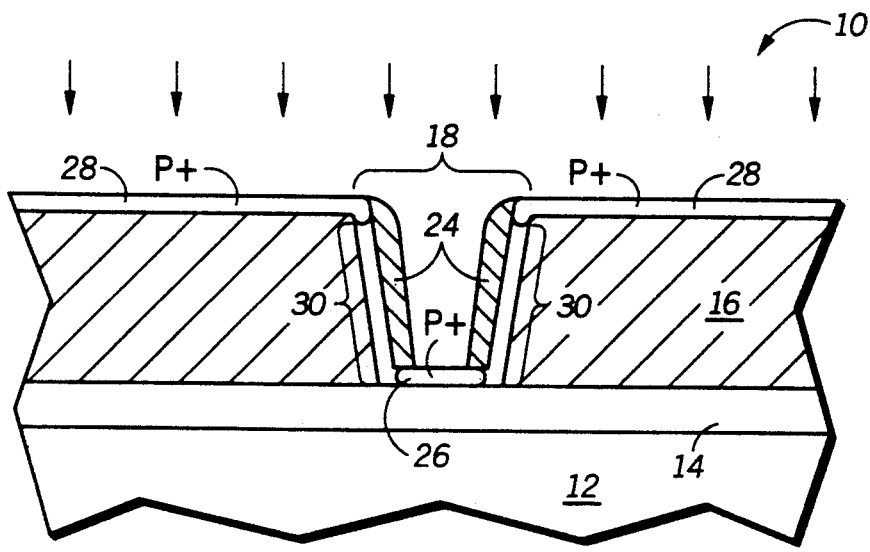

FIG. 1C illustrates electrode formation in semiconductor device 10. A sidewall spacer 24 is formed on portions of the first conductive material which lie along the vertical wall of trench 18. Sidewall spacers are well known in the art and are usually formed by depositing a dielectric such as $SiO_2$ or $Si_3N_4$ and anisotropically etching the dielectric material. The combination of the anisotropic etch and the geometry of trench 18 results in sidewall spacer 24. Furthermore, sidewall spacer 24 may be of a conductive material because the spacer will be removed later in the device fabrication, provided the conductive material used for sidewall spacer 24 can be anisotropically etched selective to first conductive material 22. Sidewall spacer 24 is used to mask the portions of first conductive material 22 which lie along the vertical wall in order to prevent these portions from being doped. As the arrows in FIG. 1C indicated, semiconductor device 10 is doped, for example by ion implantation, to form a first doped region (first current electrode 26) and a second doped region (second current electrode 28). The first and second current electrodes respectively function as a drain and a source of the transistor. As can been seen from FIG. 1C, formation of the first and second current electrodes is a self-aligned process, meaning that no lithography operations are required. While in the figure there appears to be two second current electrodes 28 formed due to the cross-sectional nature of the illustration and the shape of the trench, only one electrode which encircles trench 18 exists. Similarly, sidewall spacer 24 is a single, continuous structure within the trench rather than two distinct spacers as the cross-sectional figure seems to illustrate. Although first and second current electrodes 26 and 28 are shown as being P+ diffused regions, N+ doping may also be used if the device application requires. After doping, sidewall spacer 24 is removed using a selective isotropic etch which etches the spacer without substantially attacking other portions of the device.

As FIG. 1C illustrates, the portions of first conductive material 22 which are protected from doping by sidewall spacer 24 form a channel region 30 which connects the first and second current electrodes. Channel region 30 is also a continuous structure which is conformal to the substantially vertical wall of trench 18. The length of channel region 30 is the distance between the two doped regions, or in other words the distance between first current electrode 26 and second current electrode 28. Instead of using sidewall spacer 24 as a doping mask, channel region 30 can remain undoped during ion implantation if the walls of trench 18 are more vertical than illustrated and the implantation is performed in a direction normal to semiconductor device 10 as the arrows indicate in FIG. 1C. By not using sidewall spacer 24 several fabrication steps can be eliminated, including deposition of the spacer material, spacer etch, and spacer removal.

Figure 1D:
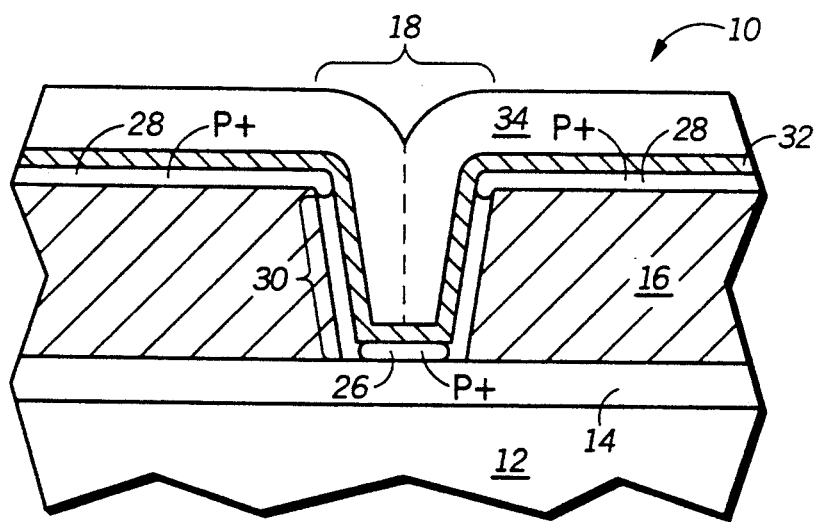

After forming first and second current electrodes, and removing sidewall spacer 24 if present, a second dielectric layer 32 is formed on semiconductor device 10 as illustrated in FIG. 1D. Second dielectric layer 32 may either be grown or deposited and has a thickness on the order of 5–30 nm. The second dielectric material functions as a gate dielectric of the transistor and is usually of $SiO_2$. A second conductive material 34 is deposited on second dielectric layer 32 using known deposition techniques. The thickness of the second conductive material of the embodiment of the present invention illustrated in FIG. 1D is large enough so that trench 18 is filled by second conductive material 34. In filling the trench with conductive material 34, care should be taken to prevent void formation. In other embodiments of the present invention, the trench need not be completely filled as will be discussed in the descriptions of FIGS. 2 and 3. Second conductive material 34 may be any conductive material known and used in the semiconductor industry, but is preferably polysilicon. As the dashed lined in FIG. 1D indicates, polysilicon deposits conformally and will therefore fill trench 18 from the substantially vertical wall inward to the center of the trench.

Figure 1E:
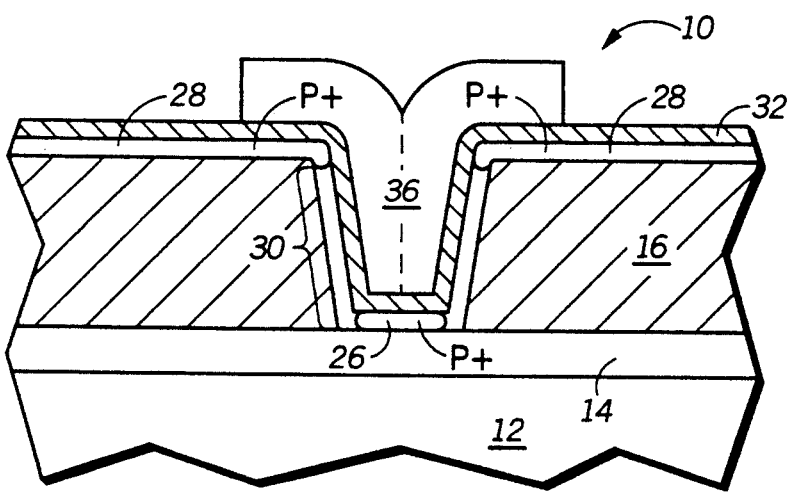
Figure 1F:
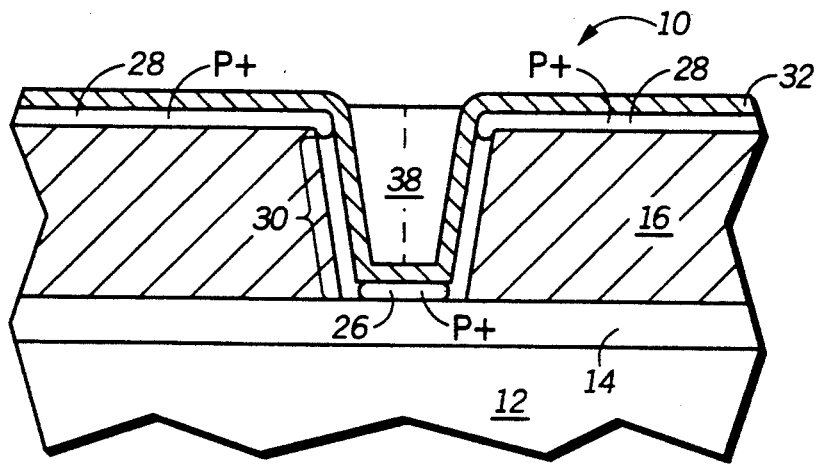

The second conductive material 34 is patterned to form a control electrode 36, illustrated in FIG. 1E, which functions as a gate of the transistor. As an alternative to patterning, the second conductive material 34 can be etched back to form a plug 38, illustrated in FIG. 1F, which can also function as the gate of the transistor. By etching back the second conductive material, the gate formation becomes a self-aligned process and furthermore results in a substantially planar device.

Whether a control electrode is formed by patterning or etch-back, the resulting transistor structure in accordance with the present invention has all the advantages of existing TFT structures, yet is more compact due to the transistor's vertical orientation. Channel region 30 is along a substantially vertical wall thereby minimizing the size of the transistor. In utilizing the present invention, the area of a transistor may be as small as one square minimum feature size, whereas many existing transistors occupy an area on the order of three or more square minimum feature sizes. In addition to reducing transistor area, the vertical channel also reduces photosensitivity of the transistor to vertically incident light. An additional feature which helps to maintain a very small transistor area is that etch stop 14 also acts as an electrical connection to first current electrode 26, thereby eliminating the need to form a contact to the electrode. In other embodiments of the present invention, etch stop 14 can be non-conductive, in which case the size of the transistor is increased slightly in order to accommodate a current electrode contact. Another advantage of the present invention is that the length of channel region 30 is very well controlled due to a high degree of control in the deposition and thickness of first dielectric material 16 and due to the presence of etch stop 14. In many existing transistor structures, channel length is determined by gate width which can vary considerably.

Additional embodiments of the present invention are illustrated in FIGS. 2 and 3. Each of these figures illustrate variations with respect to control electrode configurations and current electrode connections within a transistor. In the previous embodiment illustrated in FIGS. 1A–1F, the control electrode completely filled the trench and one of the current electrodes was electrically connected to a conductive etch stop. In the embodiments illustrated in FIGS. 2 and 3, the etch stop is non-conductive and connection to one of the current electrode is established through the trench, thereby requiring a modification to the control electrode. Illustrated in FIG. 2, a thin-film transistor structure is formed in a semiconductor device 50. The device includes a substrate 52, an etch stop 54, and a first dielectric layer 56. A vertical wall trench 58 is formed in first dielectric layer 56 such that etch stop 54 forms a bottom surface of the trench. Etch stop 54 is of a material which resists attack during the formation of trench 58 and may be a non-conductive material, for example $SiO_2$. The depth of trench 58 is similar to the depth of the trench in the previous embodiment, about 0.5-2.0 μm; however, the width of trench 58 is larger in order to accommodate a contact 70 which is electrically coupled to a first current electrode 60. By increasing the width of the trench, the area of the transistor will also be increased. First current electrode 60 and a second current electrode 62 are formed in a manner similar to the method discussed regarding current electrode formation illustrated in FIG. 1C. However, the use of a sidewall spacer to prevent a channel region 64 from being doped is not necessary since the walls of trench 58 are completely vertical. The fact that the walls are vertical will prevent the walls from being doped during ion implantation if the ion implantation is done at an angle perpendicular or normal to semiconductor device 50. However, dopants may diffuse during processing such that doped regions extend along a portion of the vertical wall.

Also included in semiconductor device 50, illustrated in FIG. 2, is a second dielectric layer 66 which functions as a gate dielectric in the transistor. The second dielectric is grown or deposited over the first and second current electrodes, 60 and 62 respectively, and along a channel region 64 which connects the two current electrodes. A portion of second dielectric layer 66 which overlies the bottom surface of trench 58 is removed in order to expose first current electrode 60. A conductive material 67, preferably of polysilicon, is deposited onto second dielectric 66 to form a control electrode. Conductive material 67 is deposited to a thickness on the order of 20 to 200 nm, leaving enough room in trench 58 to form contact 70. As with the gate dielectric, the control electrode material must be removed in regions which lie above first current electrode 60 in order to electrically couple contact 70 to the first current electrode 60. Even though a portion of conductive material 67 is removed, the control electrode formed therefrom is a continuous ring-like structure which is located, in part, within trench 58. This can be accomplished by using a sidewall spacer (not shown) along the vertical wall and adjacent to the control electrode material. A third dielectric layer 68 is deposited onto device 50 and patterned in a known manner to form a contact opening 71. Third dielectric layer 68 may be any dielectric material used in semiconductor device fabrication, including PSG, BPSG, TEOS, or the like. To reduce the number of processing steps, portions of second dielectric layer 66 may be removed during the formation of contact opening 71 as illustrated in FIG. 2. Contact 70 is then formed in the opening in third dielectric layer 68 by conventionally depositing and patterning a conductive material such as polysilicon.

Another embodiment of the present invention is illustrated in cross-section in FIG. 3. Elements from FIG. 3 which are equivalent to those of FIG. 2 are labeled the same in both figures. A semiconductor device 51 includes a transistor with many of the same elements of the device in FIG. 2. A difference in the two devices is how the control electrode is formed. In semiconductor device 50, control electrode 67 is formed by depositing and patterning a conductive material (and a dielectric layer) to expose a portion of first current electrode 60. Typically, this is accomplished by using a photoresist mask over portions of the conductive material which are to be protected from an etch, for example over the portions which form control electrode 67. In semiconductor device 51, a control electrode 69 is also formed by depositing a conductive material, but the conductive material is masked and patterned somewhat differently. Rather than masking all of the portions of the conductive material which are to be used to form the control electrode, only portions to one side of the trench are protected. In FIG. 3, the dashed line represents a photoresist mask 72 which protects portions of control electrode 69 to the right of trench 58 from being etched. To pattern the conductive material, semiconductor device 51 is exposed to an anisotropic etch which removes unmasked portions of the conductive material which lie above first current electrode 60 and portions of first current electrode which lie to the left of trench 58. During the anisotropic etch, the conductive material remains along the left vertical wall of the trench. The remaining portions of the conductive material which lie along the vertical wall of the trench adjacent gate dielectric 66, along with the masked portions of the conductive material, form a continuous control electrode 69. Again, the reason why there appears to be two control electrodes is that the view illustrated in FIG. 3 is a cross-sectional view of the trench structure. After forming control electrode 69, third dielectric layer 68 is deposited and patterned as described above, and contact 70 is formed. The embodiments of the present invention illustrated in FIG. 2 and FIG. 3 are suited for use in applications where the etch stop 54 is non-conductive or where having contact 70 located concentrically within trench 58 provides a layout advantage for the device.

Figure 4:
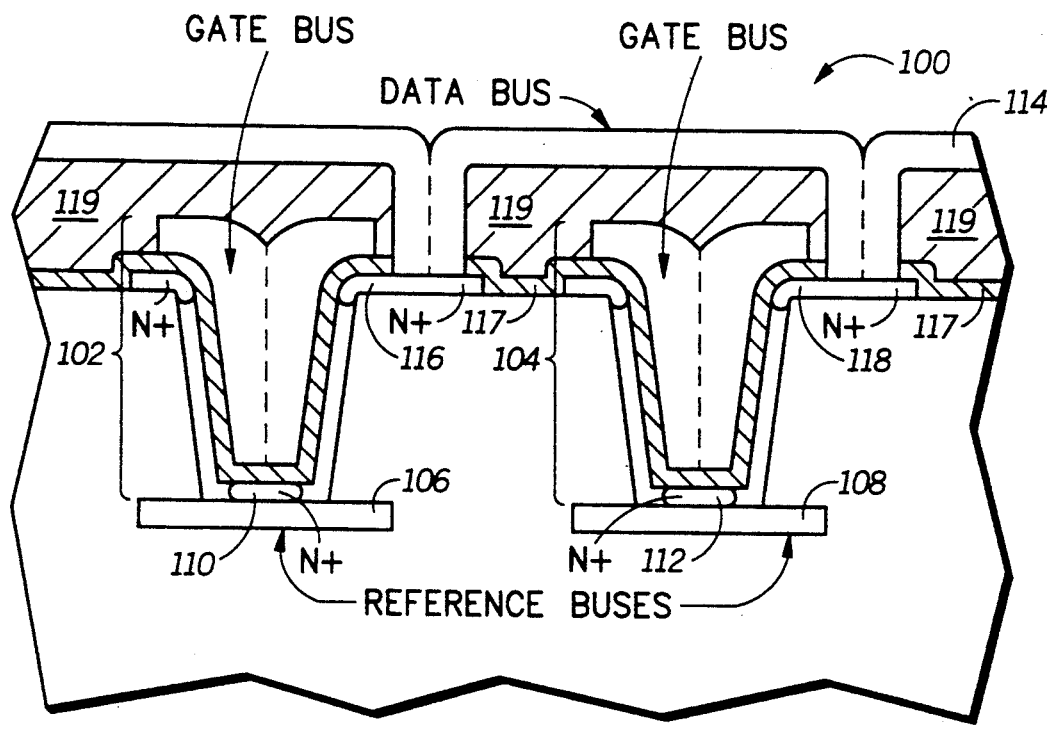
FIG. 4 is a cross-sectional view of a portion of a semiconductor device which illustrates thin-film transistors in an active matrix display application in accordance with the present invention.
Figure 5:
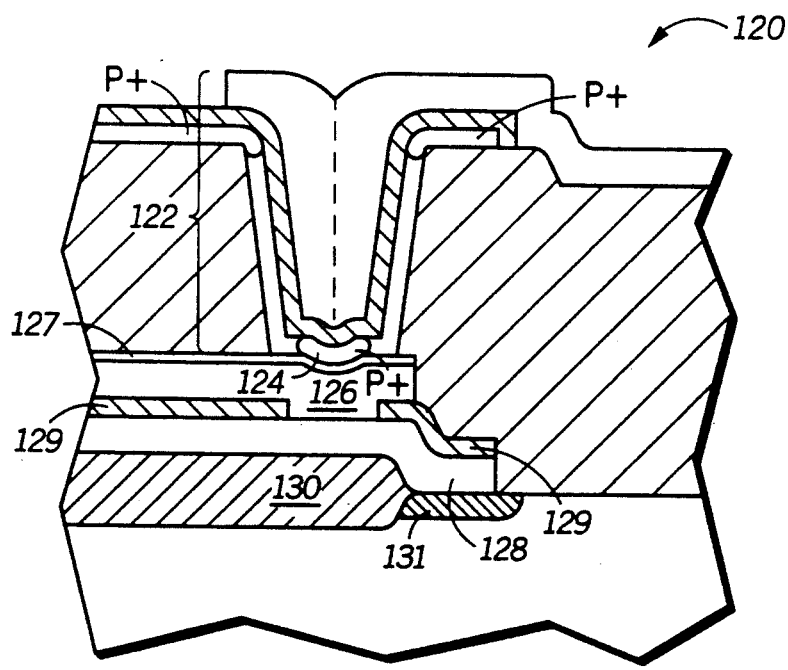
FIG. 5 is a cross-sectional view of a portion of a semiconductor device which illustrates a thin-film transistor in a digital circuit application in accordance with the present invention.

FIGS. 4 and 5 illustrate possible configurations for a semiconductor device used in an active matrix display application and a digital circuit application, respectively. A semiconductor device 100 in FIG. 4 includes two thin-film transistors 102 and 104 in accordance with the present invention. Each of these transistors is formed, for example, as described in reference to FIGS. 1A-1E. Transistors 102 and 104 are formed over conductive etch stops 106 and 108 respectively. Since the etch stops are conductive, etch stops 106 and 108 can be used as an electrical connection to first current electrodes 110 and 112, respectively, and can function as reference buses within the device. A data bus 114 is used to contact second current electrodes 116 and 118 of the two transistors. Contact is made by depositing a dielectric layer 119 over the transistors, patterning the dielectric layer (and a gate dielectric 117) to expose second current electrodes 116 and 118, and depositing a conductive material such as polysilicon.

A primary advantage to the display application illustrated in FIG. 4 is that circuit density is increased substantially over existing structures. Also, the channel of a device formed in accordance with the present invention is vertical, such that current drive of the device is determined by the perimeter of the trench in which the transistor is formed. This provides more drive current per unit layout. Another advantage is that the vertical channel reduces the photosensitivity of the transistor to vertically incident light.

FIG. 5 illustrates a semiconductor device 120 for a digital circuit application. More specifically, semiconductor device 120 is illustrated as a portion of a static random access memory (SRAM) cell. A thin-film transistor 122 is formed in the device in a manner described previously. A first current electrode 124 of the transistor is electrically coupled to an underlying first conductive layer 126 having a diffusion barrier layer 127. First conductive layer 126 is, for example, a polysilicon layer having a diffusion barrier material such as titanium nitride formed thereon. A portion of first conductive layer 126 is electrically coupled to a second conductive layer 128 while remaining portions are separated from the second conductive layer 128 by a dielectric layer 129. A buried contact 131 is formed beneath second conductive layer 128 and adjacent a field isolation region 130. While an entire SRAM cell has not been described or illustrated, the reader is directed for additional information to a co-pending, commonly assigned patent application by Sivan, entitled, "AN INTEGRATED CIRCUIT MEMORY DEVICE AND STRUCTURAL LAYOUT THEREOF," Ser. No. 07/695,053 filed May 3, 1991.

Thus it is apparent that there has been provided, in accordance with the invention, a self-aligned vertical thin-film transistor in a semiconductor device and method for making the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, conductive materials used in a device in accordance with the invention are not limited to polysilicon, but may be amorphous silicon, germanium, gallium arsenide, diamond, or other materials used as conducting or semiconducting layers within the semiconductor art. Likewise, the semiconductor device of the present invention is not limited to use in active matrix displays and digital circuits. The invention is suitable for use with any device incorporating transistors. Furthermore, the substrate material on which a transistor in accordance with the present invention is formed is not limited to those substrates described. The substrate may be any material or layer within a semiconductor device. In addition, the use of an etch stop material is not required but is a preferred method of controlling channel length. If an etch stop is used, the material used to form the etch stop may be either conductive or non-conductive. It is also important to note that the present invention is not limited in any way to specific deposition, growth, or etching techniques used to form a device in accordance with the invention. Furthermore, the present invention may also be used in conjunction with vertically oriented resistors formed in trenches, rather than transistors. In using the teachings of the invention with resistor applications, the control electrode or gate is omitted while the remaining elements of the transistor are kept the same. The channel region of the transistor becomes the high resistivity area for the resistor, which may be formed using either n-type or p-type dopants. Therefore, it is intended that this invention encompass all such variations and modifications as fall within the scope of the appended claims.

I claim:

1. A method for making a self-aligned vertical thin-film transistor in a semiconductor device comprising the steps of:

providing a substrate of a first dielectric material having an upper and lower surface, and a substantially vertical wall trench formed therein, the trench having a bottom surface which does not extend below the lower surface of the dielectric substrate and having a depth;

depositing a first conductive material overlying the dielectric substrate and substantially conforming to the trench;

forming a first current electrode in a portion of the first conductive material overlying the bottom surface of the trench;

forming a second current electrode in a portion of the first conductive material overlying the upper surface of the dielectric substrate;

forming a channel region in a portion of the first conductive material along the vertical wall of the trench between the first and second current electrodes;

forming a second dielectric material adjacent the channel region;

forming a control electrode of a second conductive material within the trench such that the control electrode substantially conforms to the wall of the trench, is electrically isolated from the channel region by the second dielectric material, and is electrically isolated from the first current electrode;

forming a third dielectric material adjacent the control electrode and within the trench;

forming a contact opening in the third dielectric material within the trench to expose a portion of the first current electrode; and forming a contact to the exposed portion of the first current electrode, the contact being electrically coupled to the first current electrode and electrically isolated from the control electrode.

2. The method of claim 1 wherein the step of forming a channel region comprises forming a channel region having a length substantially equal to the depth of the trench.

3. The method of claim 1 wherein the step of depositing a first conductive material comprises depositing either amorphous silicon or polysilicon.

4. The method of claim 1 wherein the steps of forming a first current electrode, forming a second current electrode, and forming a channel region comprise the step of doping the first conductive material of the semiconductor device by ion implantation to form the first and second current electrodes and the channel region.

5. The method of claim 4 wherein the step of doping the first conductive material comprises doping the semiconductor device at an angle normal to the semiconductor device to prevent the channel region from being doped.

6. The method of claim 4 further comprising the step of forming a sacrificial sidewall spacer along the substantially vertical wall trench to prevent the channel region from being doped.

7. The method of claim 2 wherein the step of providing a substrate comprises providing a substrate having a substantially vertical wall trench having a depth of between approximately 0.5-2.0 $\mu$m.

8. The method of claim 1 wherein the step of providing a first dielectric material comprises providing a dielectric material selected from a group consisting of: quartz, glass, and deposited $SiO_2$.

9. A method for making a self aligned vertical thin-film transistor in a semiconductor device comprising the steps of:

providing a substrate;

forming a first dielectric material overlying the substrate;

forming a second dielectric material on the first dielectric material, the second dielectric material having the ability to be etched selectively to the first dielectric material;

forming a trench in the second dielectric material using the first dielectric material as an etch stop which forms a bottom surface of the trench, the trench having substantially vertical sidewalls;

depositing a first conductive layer overlying the second dielectric material, the first conductive layer conforming to the trench;

doping the first conductive layer to form a first current electrode at the bottom of the trench, a second current electrode overlying the second dielectric material and adjacent the trench, and a channel region adjacent the second dielectric material along the trench sidewalls;

forming a third dielectric material adjacent the channel region;

forming a control electrode within and conforming to the trench and electrically isolated from the channel region and from the first current electrode by the third dielectric material;

forming a fourth dielectric material adjacent the control electrode and within the trench;

forming a contact opening in the fourth dielectric within the trench to expose a portion of the first current electrode; and forming a contact in the contract opening which is electrically coupled to the first current electrode and electrically isolated from the control electrode.

10. The method of claim 9 wherein the step of depositing a first conductive layer comprises depositing either polysilicon or amorphous silicon.

11. The method of claim 9 wherein the step of doping the first conductive layer comprises implanting dopants into portions of the first conductive layer other than the channel region.

12. The method of claim 9 wherein the step of providing a substrate comprises providing a semiconductor substrate.

13. A method for making a self-aligned vertical thin-film transistor in a semiconductor device comprising the steps of:

providing a substrate having an overlying etch stop layer formed of a non-conductive material;

depositing a first dielectric material on the etch stop layer;

etching the first dielectric material to form a trench, wherein etching is terminated upon exposing, but substantially unaltering, a portion of the etch stop layer, the exposed portion of the etch stop layer forming a bottom surface of the trench;

depositing a conductive layer overlying the first dielectric material and conforming to the trench;

forming a first current electrode in a portion of the conductive layer overlying the bottom of the trench;

forming a second current electrode in a portion of the conductive layer overlying the first dielectric and adjacent the trench;

forming a channel region in a portion of the conductive layer between the first and second current electrodes;

forming a second dielectric material on the channel region of the conductive layer;

forming a control electrode within the trench and electrically isolated from the channel region by the second dielectric material;

patterning the control electrode and the second dielectric material to expose a portion of the first current electrode within the trench; and forming a contact to the exposed portion of the first current electrode.

14. The method of claim 13 wherein the steps of forming a first current electrode, forming a second current electrode, and forming a channel region comprise doping selected portions of the conductive layer using ion implantation.

15. The method of claim 1 wherein the step of forming a contact comprises forming a contact which is encircled by the control electrode within the trench.

16. The method of claim 9 wherein the step of forming a contact comprises forming a contact which is encircled by the control electrode within the trench.

17. The method of claim 13 wherein the step of forming a contact comprises forming a contact which is encircled by the control electrode within the trench.

* * * * *